United States Patent
Yamaji

(10) Patent No.: US 10,566,410 B2
(45) Date of Patent: Feb. 18, 2020

(54) HIGH BREAKDOWN VOLTAGE PASSIVE ELEMENT

(71) Applicant: FUJI ELECTRIC CO., LTD., Kawasaki-shi, Kanagawa (JP)

(72) Inventor: Masaharu Yamaji, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 16/267,699

(22) Filed: Feb. 5, 2019

(65) Prior Publication Data

US 2019/0172900 A1 Jun. 6, 2019

Related U.S. Application Data

(62) Division of application No. 15/864,954, filed on Jan. 8, 2018, now Pat. No. 10,224,390, which is a division
(Continued)

(30) Foreign Application Priority Data

Jan. 14, 2015 (JP) ................................. 2015-005138

(51) Int. Cl.
*H01L 23/522* (2006.01)
*H01L 23/00* (2006.01)
(Continued)

(52) U.S. Cl.
CPC .......... *H01L 28/10* (2013.01); *H01L 23/5223* (2013.01); *H01L 23/5227* (2013.01);
(Continued)

(58) Field of Classification Search
CPC . H01L 28/60; H01L 23/5223; H01L 23/5277; H01L 28/10; H01L 2924/0002;
(Continued)

(56) References Cited

U.S. PATENT DOCUMENTS 4,602,318 A 7/1986 Lassen
5,583,474 A 12/1996 Mizoguchi et al.
(Continued)

FOREIGN PATENT DOCUMENTS

EP 0851480 A2 7/1998
GB 2358285 A 7/2001
(Continued)

OTHER PUBLICATIONS

Hiroshi Shinoda et al., "Insulated Signal Transmission System using Planar Resonant Coupling Technology for High Voltage IGBT Gate Driver", 2014 IEEE Energy Conversion Congress and Exposition (ECCE), Sep. 14-18, 2014, pp. 265-270.
(Continued)

*Primary Examiner* — Thinh T Nguyen
(74) *Attorney, Agent, or Firm* — Rabin & Berdo, P.C.

(57) ABSTRACT

Warping of a semiconductor wafer occurring due to a difference in the thermal expansion rates of an insulating film and the semiconductor wafer is restricted. Therefore, processing failures and conveying failures in the manufacturing process, as well as cracking of the semiconductor wafer, are restricted. Provided is a high breakdown voltage passive element including a substrate, a lower metal layer and upper metal layer stacked on the substrate, and an insulating unit formed between the lower metal layer and upper metal layer, wherein the insulating unit has a first insulating film whose thermal expansion rate is lower than the thermal expansion rate of the substrate, and a second insulating film, formed on the first insulating film, whose thermal expansion rate is higher than the thermal expansion rate of the substrate.

4 Claims, 15 Drawing Sheets

Related U.S. Application Data of application No. 14/960,257, filed on Dec. 4, 2015, now abandoned.

(51) Int. Cl.
*H01L 49/02* (2006.01)
*H01L 23/373* (2006.01)

(52) U.S. Cl.
CPC .......... *H01L 28/60* (2013.01); *H01L 23/3735* (2013.01); *H01L 23/562* (2013.01); *H01L 2224/48091* (2013.01); *H01L 2924/0002* (2013.01)

(58) Field of Classification Search
CPC .............. H01L 23/3735; H01L 23/562; H01L 2924/00014
USPC ........ 257/528, 531, 616, 758, 760; 438/118, 438/329, 622
See application file for complete search history.

(56) References Cited

U.S. PATENT DOCUMENTS

| | | | |
|---|---|---|---|
| 6,037,634 | A | 3/2000 | Akiyama |
| 8,987,861 | B2 | 3/2015 | Funaya et al. |
| 9,711,451 | B2 | 7/2017 | Igarashi et al. |
| 2008/0265423 | A1 | 10/2008 | Ruben |
| 2009/0309688 | A1 | 12/2009 | Kawano |
| 2012/0020419 | A1* | 1/2012 | Kaeriyama ......... H01L 25/4902 375/259 |
| 2013/0055052 | A1 | 2/2013 | Kaeriyama |
| 2014/0042662 | A1 | 2/2014 | Tamada et al. |
| 2014/0175602 | A1 | 6/2014 | Funaya et al. |
| 2015/0125665 | A1 | 5/2015 | Nakase et al. |
| 2015/0235955 | A1 | 8/2015 | Kudo et al. |
| 2016/0027732 | A1 | 1/2016 | Igarashi et al. |
| 2016/0035672 | A1 | 2/2016 | Funaya et al. |

FOREIGN PATENT DOCUMENTS

| | | |
|---|---|---|
| JP | S59-072745 A | 4/1984 |
| JP | H06-089893 A | 3/1994 |
| JP | H07-122635 A | 5/1995 |
| JP | H07-142707 A | 6/1995 |
| JP | H08-227834 A | 9/1996 |
| JP | 3378135 B2 | 2/2003 |
| JP | 3441082 B2 | 8/2003 |
| JP | 2005-026404 A | 1/2005 |
| JP | 2006-261552 A | 9/2006 |
| JP | 2008-270465 A | 11/2008 |
| JP | 2013-051547 A | 3/2013 |
| WO | WO-2014-069662 A1 | 5/2014 |

OTHER PUBLICATIONS

Shinichi Uchida et al., "A face-to-face chip stacking 7kV RMS digital isolator for automotive and industrial motor drive applications", Proceedings of 2014 IEEE 26th International Symposium on Power Semiconductor Devices & IC's (ISPSD), Jun. 15-19, 2014, pp. 442-445.

* cited by examiner

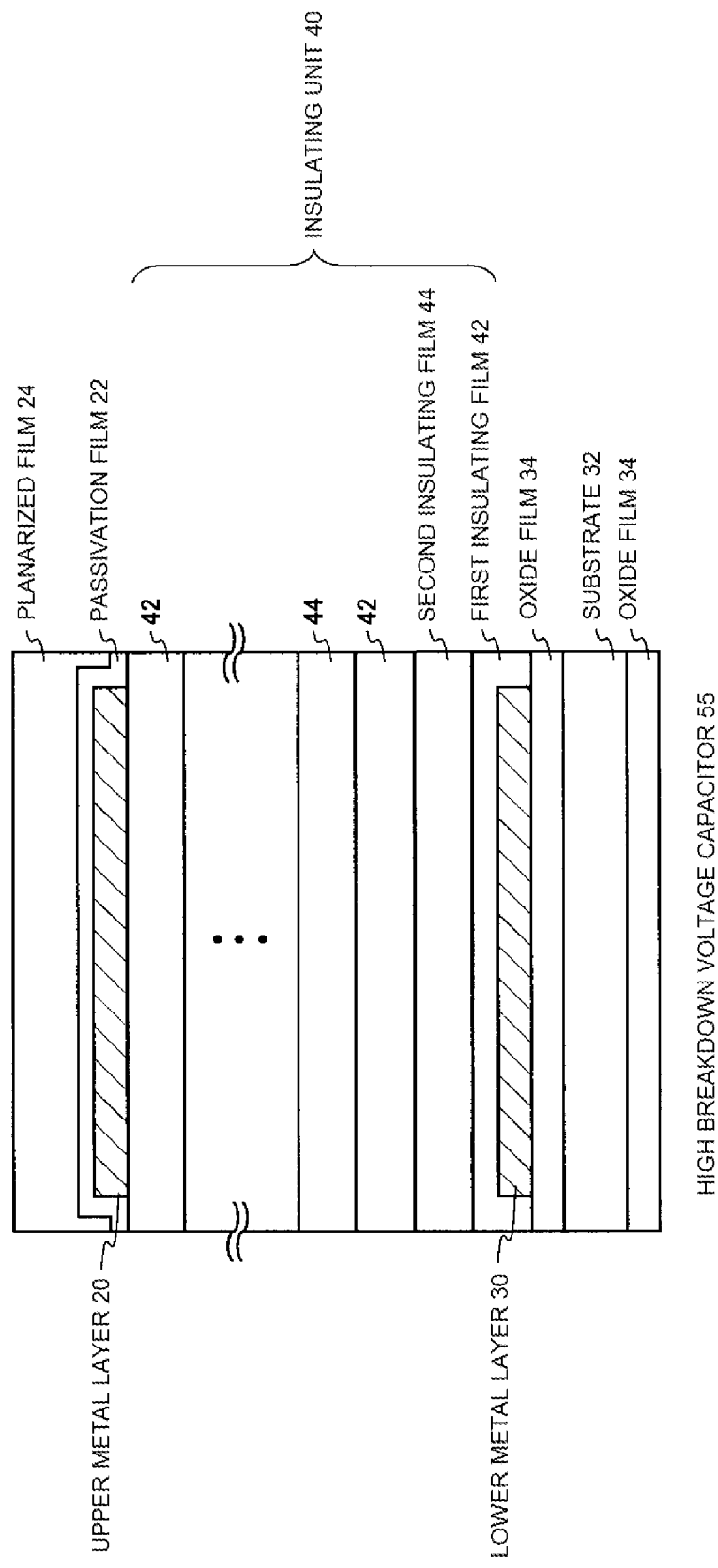

HIGH BREAKDOWN VOLTAGE PASSIVE ELEMENT

CROSS-REFERENCE TO RELATED APPLICATION

This application is a divisional of U.S. application Ser. No. 15/864,954, filed on Jan. 8, 2018, and allowed on Oct. 25, 2018, which is a divisional of U.S. application Ser. No. 14/960,257, filed on Dec. 4, 2015. Further, these applications are based on, and claims priority to, Japanese Patent Application No. 2015-005138, filed on Jan. 14, 2015, contents of which are incorporated herein by reference.

BACKGROUND OF THE INVENTION

1. Field of the Invention

The present invention relates to a high breakdown voltage passive element and a high breakdown voltage passive element manufacturing method.

2. Description of the Background Art

As existing technology, drive devices having a stacked passive element are known (for example, JP-A-2013-051547). Also, drive devices having a planar passive element are known (for example, Japanese Patent No. 3,441,082).

SUMMARY OF THE INVENTION

A passive element is formed on, for example, a semiconductor wafer. The passive element has an insulating film on the semiconductor wafer. Warping of the semiconductor wafer caused by a difference in the thermal expansion rates of the semiconductor wafer and insulating film occurs in the process of manufacturing the passive element. Warping of the semiconductor wafer causes processing failures and conveying failures in the manufacturing process, as well as cracking of the semiconductor wafer. Processing failures in the manufacturing process include defocus and misalignment in a stepper device, and the like.

A first aspect of the invention provides a high breakdown voltage passive element including a substrate, a lower metal layer and upper metal layer stacked on the substrate, and an insulating unit formed between the lower metal layer and upper metal layer, wherein the insulating unit has a first insulating film whose thermal expansion rate is lower than the thermal expansion rate of the substrate, and a second insulating film, formed on the first insulating film, whose thermal expansion rate is higher than the thermal expansion rate of the substrate.

A second aspect of the invention provides a high breakdown voltage passive element including a substrate, an insulating unit formed on the upper surface side of the substrate, and a metal layer provided in one plane on the upper surface side of the insulating unit, wherein the insulating unit has a first insulating film, whose thermal expansion rate is lower than the thermal expansion rate of the substrate, and a second insulating film, whose thermal expansion rate is higher than the thermal expansion rate of the substrate, stacked on the upper surface side of the substrate.

The ratio between the thickness of the first insulating film and the thickness of the second insulating film is such as to offset warping of the substrate. The first insulating film may be a plasma TEOS film, and the second insulating film may be a polyimide film or a polybenzoxazole film. Also, the first insulating film may be a plasma CVD film, and the second insulating film may be a PSG film, a BPSG film, or an NSG film.

The insulating unit may have two first insulating films sandwiching the second insulating film. Also, the insulating unit may have two second insulating films sandwiching the first insulating film. The thickness of the insulating film on the uppermost layer in the insulating unit may be greater than that of the other insulating films. The thickness of the insulating unit may be 5 µm or more.

The thickness of each of the first insulating film and second insulating film may be 0.5 to 3.0 µm. The ratio between the thickness of the first insulating film and the thickness of the second insulating film may be 1:1 to 2:1.

A third aspect of the invention provides a high breakdown voltage passive element manufacturing method including a stage of providing a lower metal layer on the front surface side of a substrate, a stage of providing an insulating unit wherein a first insulating film, whose thermal expansion rate is lower than the thermal expansion rate of the substrate, and a second insulating film, whose thermal expansion rate is higher than the thermal expansion rate of the substrate, are stacked on the front surface side of the lower metal layer, and a stage of providing an upper metal layer on the front surface side of the insulating unit, wherein the temperature at which one of the first insulating film or second insulating film is formed is a temperature such that does not cause the properties of the other, already formed, film to change.

A fourth aspect of the invention provides a high breakdown voltage passive element manufacturing method including a stage of providing on a substrate a first insulating film, whose thermal expansion rate is lower than the thermal expansion rate of the substrate, and a second insulating film, whose thermal expansion rate is higher than the thermal expansion rate of the substrate, and a stage of providing a metal layer on the first insulating film and second insulating film, wherein the temperature at which one of the first insulating film or second insulating film is formed is a temperature such that does not cause the properties of the other, already formed, film to change.

The heretofore described outline of the invention does not enumerate all the necessary characteristics of the invention. Also, sub-combinations of this group of characteristics may also be included in the invention.

BRIEF DESCRIPTION OF THE DRAWINGS

FIG. 15 is a diagram showing a high breakdown voltage capacitor 55.

DETAILED DESCRIPTION OF THE INVENTION

Hereafter, the invention will be described using an embodiment of the invention, but the following embodiment does not limit the invention according to the claims. Also, it is not necessarily the case that all the combinations of characteristics described in the embodiment are essential in order to resolve the problem of the existing technology.

Figure 1:
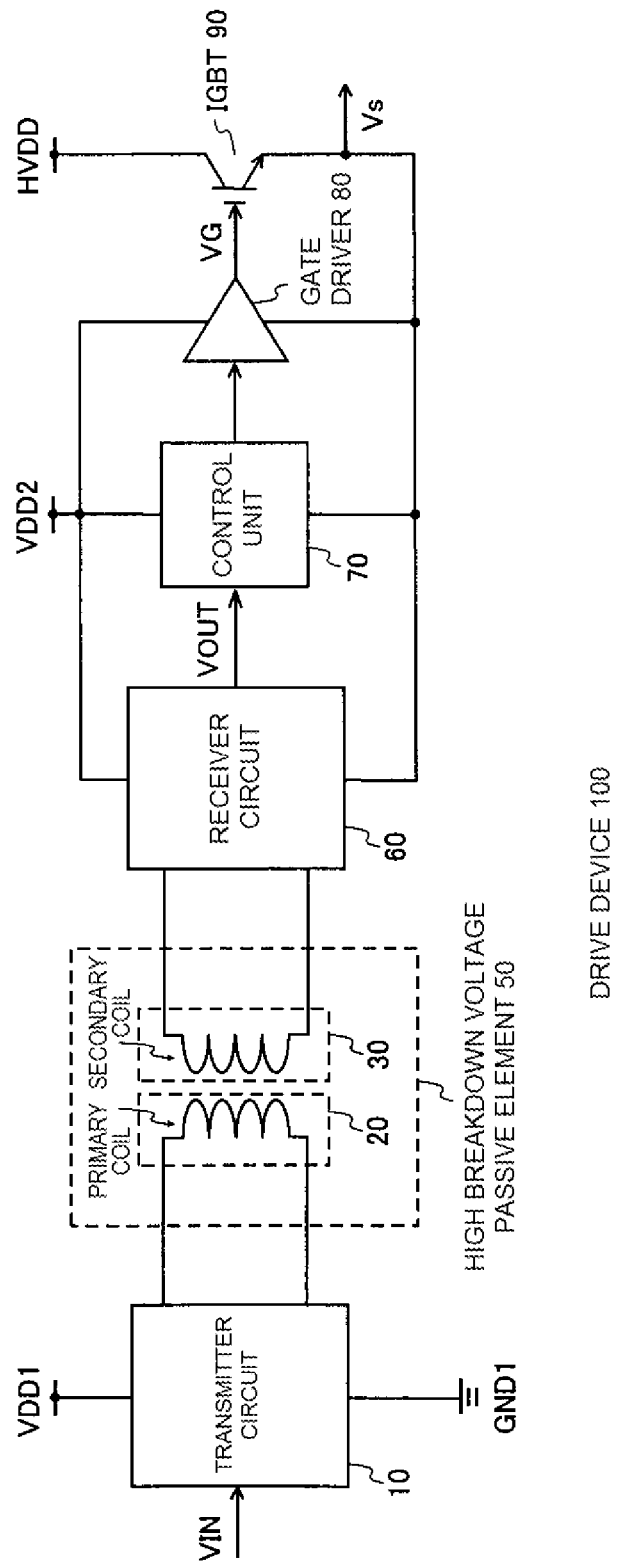
FIG. 1 is a diagram showing a drive device 100.

FIG. 1 is a diagram showing a drive device 100. The drive device 100 has a transmitter circuit 10, a high breakdown voltage passive element 50, a receiver circuit 60, a control unit 70, and a gate driver 80. Further, an insulated gate bipolar transistor (IGBT) 90, which is a switch element, is driven by the drive device 100. A first system power supply having a power supply voltage VDD1 and ground voltage GND1 is connected to the transmitter circuit 10. The transmitter circuit 10 may be provided on a first semiconductor chip. Input data VIN are input into the transmitter circuit 10. The transmitter circuit 10 converts the input data VIN into a pulse-form electrical signal, and outputs the signal to the high breakdown voltage passive element 50.

The high breakdown voltage passive element 50 has a pair of coils. The high breakdown voltage passive element 50 may be provided on a second semiconductor chip differing from the first semiconductor chip. The high breakdown voltage passive element 50 of this example has a lower metal layer 30 and upper metal layer 20 stacked on a substrate. That is, the high breakdown voltage passive element 50 of this example is of a so-called stacked type.

The high breakdown voltage passive element 50 of this example has a primary coil formed on the upper metal layer 20. In this example, the primary coil is connected to the transmitter circuit 10. Also, the high breakdown voltage passive element 50 of this example has a secondary coil formed on the lower metal layer 30. In this example, the secondary coil is connected to the receiver circuit 60.

The high breakdown voltage passive element 50 may have an insulating unit stacked on the upper surface side of the substrate, and a metal layer provided in one plane on the upper surface side of the insulating unit. That is, the high breakdown voltage passive element 50 of this example may be of a so-called planar type.

Also, in another example, the primary coil may be formed on the lower metal layer 30 and the secondary coil formed on the upper metal layer 20. That is, the lower metal layer 30 may be connected to the transmitter circuit 10, and the upper metal layer 20 connected to the receiver circuit 60. When forming the high breakdown voltage passive element 50 on the first semiconductor chip, it is desirable that the lower metal layer 30 (primary coil) and upper metal layer 20 (secondary coil) are formed above the surface of the first semiconductor chip on the side on which the transmitter circuit 10 is formed.

In this example, the pulse-form electrical signal output from the transmitter circuit 10 is converted into a magnetic signal by the primary coil of the upper metal layer 20. The secondary coil of the lower metal layer 30 generates an electrical signal in accordance with the magnetic signal of the primary coil of the upper metal layer 20. That is, the secondary coil of the lower metal layer 30 generates an electrical signal using electromagnetic induction caused by variation in the magnetic field of the magnetic signal. The receiver circuit 60 receives the generated electrical signal.

A second system power supply having a power supply voltage VDD2 and load drive voltage VS is connected to the receiver circuit 60, control unit 70, and gate driver 80. The power supply voltage VDD2 fluctuates in accordance with fluctuation of the load drive voltage VS. The second system power supply is configured of an unshown capacitor and the like. The receiver circuit 60, control unit 70, and gate driver 80 may be provided on a third semiconductor chip differing from the first semiconductor chip and second semiconductor chip. The first to third semiconductor chips may be silicon (Si) chips, or may be silicon carbide (SiC) chips.

The receiver circuit 60 inputs output data VOUT, which are the electrical signal generated by the secondary coil, into the control unit 70. In this way, the input data VIN input into the transmitter circuit 10 are reproduced as the output data VOUT by the receiver circuit 60.

The control unit 70 determines whether the output data VOUT are normal or abnormal. When determining that the output data VOUT are normal, the control unit 70 inputs the output data VOUT into the gate driver 80. However, when determining that the output data VOUT are abnormal, the control unit 70 inputs an operation stop signal into the gate driver 80. In this case, the gate driver 80 does not operate.

For example, when the voltage of the output data VOUT exceeds a preset threshold, the control unit 70 determines that the output data VOUT are abnormal. In this case, rather than inputting the output data VOUT into the gate driver 80, the control unit 70 inputs an operation stop signal. When the pulse width of the electrical signal of the output data VOUT exceeds a preset threshold, or when the difference between the power supply voltage VDD1 and power supply voltage VDD2 exceeds a preset threshold, the control unit 70 may determine that the output data VOUT are abnormal. Therefore, malfunction of the drive device 100 can be prevented.

When the output data VOUT are input, the gate driver 80 inputs agate signal VG in accordance with the output data VOUT into the gate of the IGBT 90. For example, the gate driver 80 inputs a high or low level electrical signal into the gate of the IGBT 90 as the gate signal VG in accordance with a high or low level of the electrical signal of the output data VOUT.

A power supply voltage HVDD, which is a voltage higher than the power supply voltage VDD2, is connected to the collector of the IGBT 90. The IGBT 90 is in an on-state at a timing at which the gate signal VG is at the high level, and in an off-state at a timing at which the gate signal VG is at the low level. When the IGBT 90 is in an on-state, a load drive voltage Vs is output from the emitter. A load connected to the IGBT 90 is driven by the load drive voltage Vs. When an operation stop signal is input from the control unit 70, the gate driver 80 does not operate. Consequently, in this case, the IGBT 90 does not operate either. A power MOSFET may be used instead of the IGBT 90.

When handling the high power supply voltage HVDD, the high breakdown voltage passive element 50 of this example electrically isolates the transmitter circuit 10 from the receiver circuit 60 and IGBT 90. Therefore, an accident whereby a person handling the transmitter circuit 10 side is electrocuted by the high power supply voltage HVDD can be prevented. Also, when the first to third semiconductor chips are SiC chips, the drive device 100 can operate even at a temperature of 200° C., which is difficult with an existing photocoupler.

Figure 2:
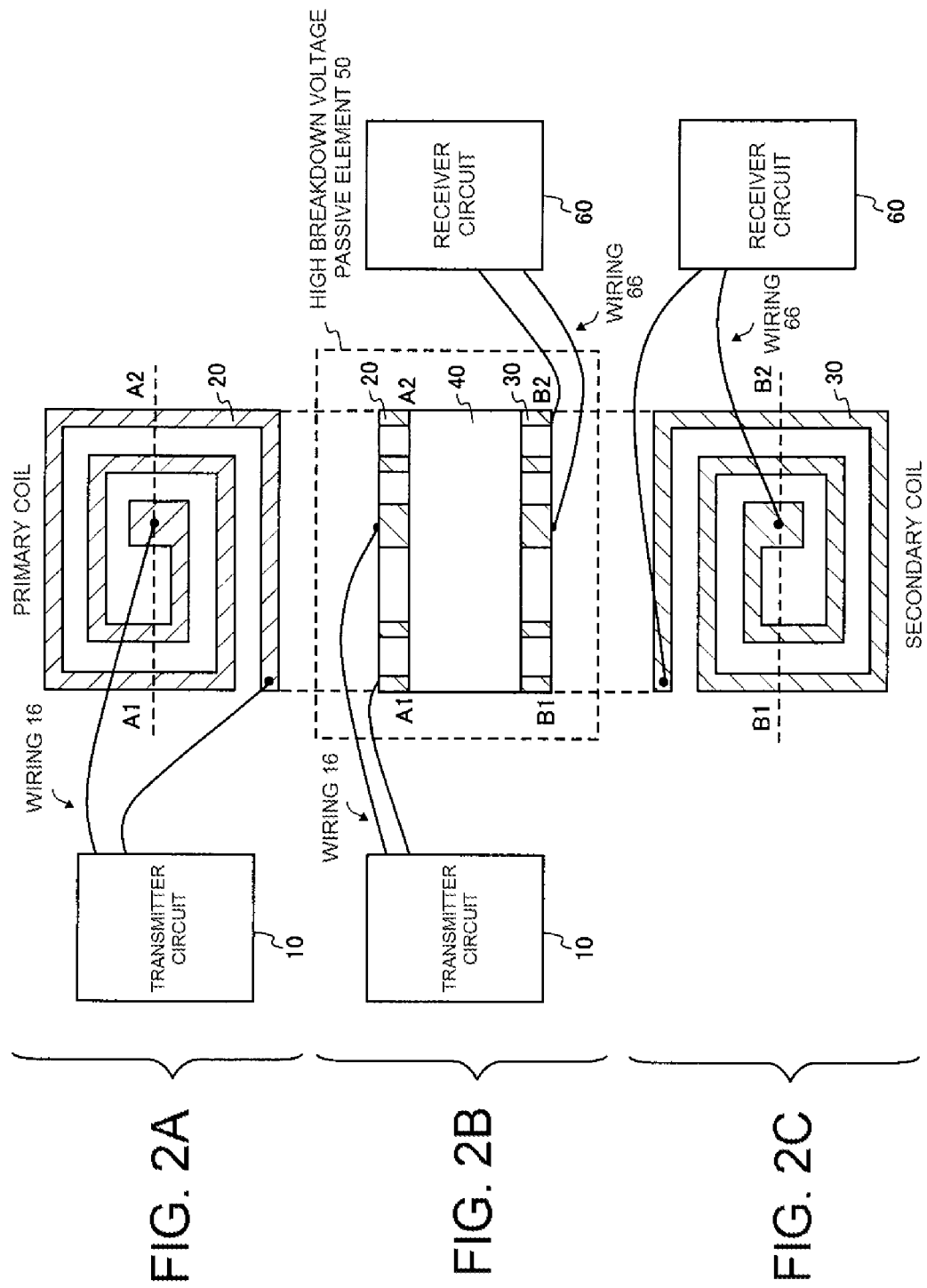
FIGS. 2A to 2C are diagrams showing a stacked type high breakdown voltage passive element 50.

FIGS. 2A to 2C are diagrams showing the stacked type high breakdown voltage passive element 50. FIG. 2A shows a top view of the high breakdown voltage passive element 50. FIG. 2B shows a sectional view of the high breakdown voltage passive element 50. FIG. 2C shows a bottom view of the high breakdown voltage passive element 50. A section A1-A2 of FIG. 2A and a section B1-B2 of FIG. 2C are shown combined in FIG. 2B.

As shown in the top view of FIG. 2A, the primary coil is formed on the upper metal layer 20. Both ends of the upper metal layer 20 are connected via wiring 16 to the transmitter circuit 10. As shown in the sectional view of FIG. 2B, the high breakdown voltage passive element 50 of this example has the upper metal layer 20 and lower metal layer 30. An insulating unit 40 is provided between the lower metal layer 30 and upper metal layer 20. As shown in the bottom view of FIG. 2C, the secondary coil is formed on the lower metal layer 30. Both ends of the lower metal layer 30 are connected via wiring 66 to the receiver circuit 60.

The wiring 16 and wiring 66 are not provided in the insulating unit 40. The wiring 16 and wiring 66 are electrically connected to lead wiring units provided in the primary coil and secondary coil. Also, a lead wiring unit may be provided in a through-silicon via (TSV), which is an electrode provided penetrating a silicon substrate provided in contact with the lower metal layer 30.

Figure 3:
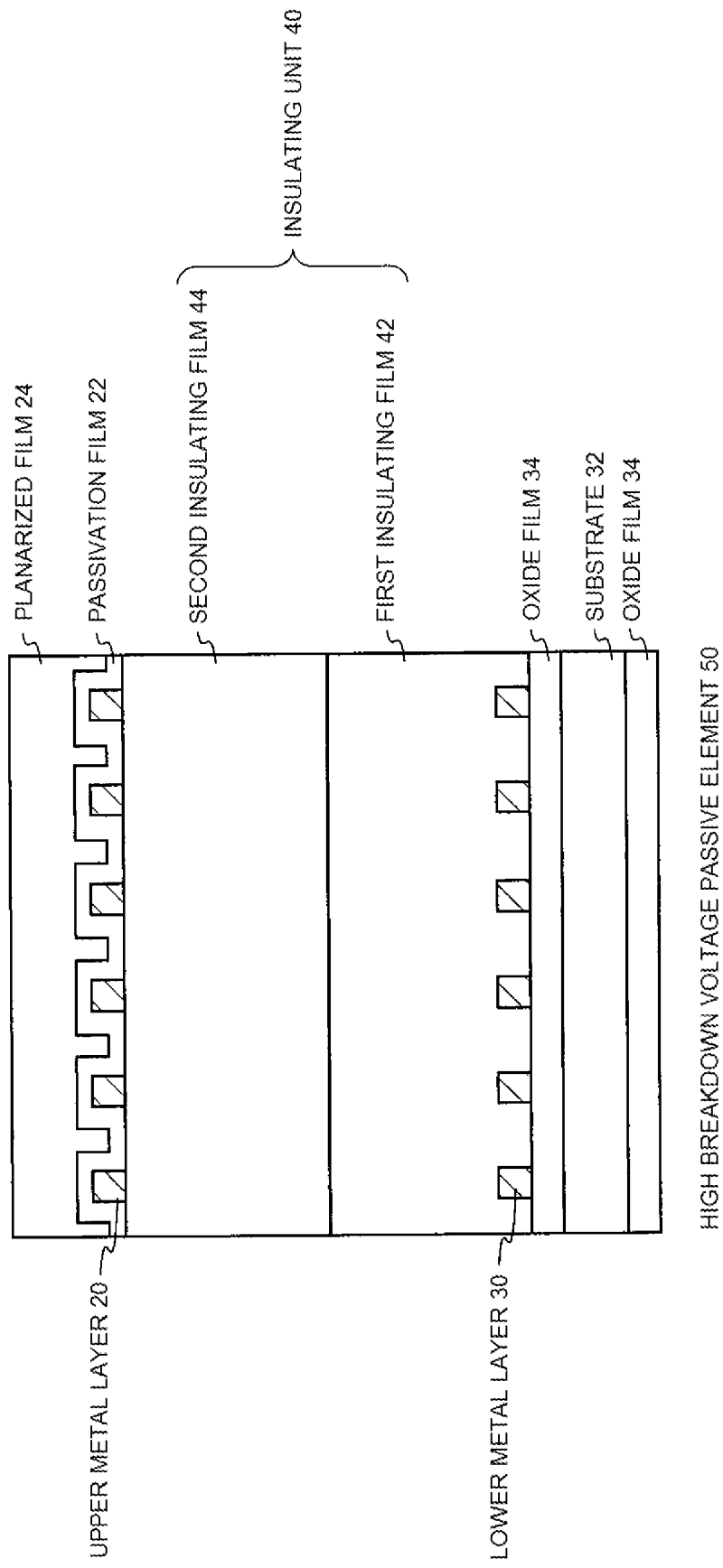
FIG. 3 is a diagram showing a first example of the stacked type high breakdown voltage passive element 50.

FIG. 3 is a diagram showing a first example of the stacked type high breakdown voltage passive element 50. In the specification, a direction from a substrate 32 of the high breakdown voltage passive element 50 toward a planarized film 24 is called an upward direction, while the opposite direction is called a downward direction. For example, the insulating unit 40 being provided above the substrate 32 means that the insulating unit 40 is positioned upward of the substrate 32.

The high breakdown voltage passive element 50 of this example has the substrate 32. The substrate 32 of this example is a silicon substrate. The silicon substrate may have a thickness of 625 μm to 725 μm. The substrate 32 has an oxide film 34 on both surfaces. The oxide film 34 may be a silicon thermal oxide film. The substrate 32 may be a SiC substrate. In this case, the oxide film 34 may be a silicon dioxide ($SiO_2$) film.

The high breakdown voltage passive element 50 of this example includes the lower metal layer 30 and upper metal layer 20 stacked above the substrate 32. Also, the high breakdown voltage passive element 50 of this example includes the insulating unit 40 formed between the lower metal layer 30 and upper metal layer 20. The lower metal layer 30 is provided in contact with the oxide film 34.

Generally, a polyimide film, a silicon oxide film wherein tetraethoxysilane (TEOS) is used for the material, and a silicon thermal oxide film have dielectric breakdown strengths of in the region of 4 MV/cm, in the region of 8 MV/cm, and in the region of 10 to 14 MV/cm respectively.

M means 10 to the power of 6. Although depending also on the film properties, a thickness of 25 μm or more for a polyimide film, 15 μm or more for a silicon oxide film using TEOS, or 10 μm or more for a silicon thermal oxide film, is necessary in order to obtain a dielectric breakdown strength of 5 kVrms (root mean square voltage) or more. k means 10 to the power of 3.

For example, when forming a single layer polyimide film on a 6-inch silicon substrate, firstly, a liquid-form polyimide film is applied to a thickness of in the region of 16 μm. Subsequently, curing (hardening) is carried out at a temperature of in the region of 400° C. Subsequently again, the polyimide film is cooled to room temperature. At this time, the polyimide film contracts to a thickness of in the region of 10 μm. At this time, the silicon substrate is in a state of protruding in a direction opposed to the surface on which the polyimide is provided. That is, the silicon substrate is in a so-called concave state. The amount of warping of the silicon substrate is in the region of 100 to 140 μm. When providing a polyimide film of a thickness of 25 μm, the amount of warping of the silicon substrate increases further.

The thermal expansion rate of silicon is 3 ppm/° C. As opposed to this, the thermal expansion rate of polyimide is 30 to 60 ppm/° C. That is, the thermal expansion rate of polyimide is approximately ten times greater than the thermal expansion rate of silicon. A material with a high thermal expansion rate expands more than a material with a low thermal expansion rate in response to a temperature rise. Therefore, a material with a high thermal expansion rate contracts more than a material with a low thermal expansion rate in response to a fall in temperature after a temperature rise.

As heretofore described, when forming a polyimide film on a silicon substrate, the polyimide film contracts more than the silicon substrate when cooling after hardening. Therefore, the silicon substrate is in a state of protruding in a direction opposed to the surface on which the polyimide film is provided. That is, the silicon substrate is in a so-called concave state.

As opposed to this, the thermal expansion rate of a silicon oxide film is 0.3 ppm/° C. That is, the thermal expansion rate of a silicon oxide film is approximately ten times smaller than the thermal expansion rate of silicon.

A thermal oxide film (silicon oxide film) can be provided on the silicon substrate by heating the silicon substrate at 1,000° C. Also, a silicon oxide film can be provided on the silicon substrate by depositing the silicon oxide film while heating the substrate using a CVD device. Although a thermal oxide film and a silicon oxide film deposited using a CVD device are both silicon oxide films, the film properties differ.

In both the case of a thermal oxide film and the case of a silicon oxide film, the silicon substrate is cooled to, for example, room temperature after the silicon oxide film is formed. When cooling, the silicon substrate contracts more than the silicon oxide film. As the contraction rate of silicon is greater than that of the silicon oxide film, the silicon substrate is in a state of protruding in the direction of the surface on which the silicon oxide film is provided. That is, the silicon substrate is in a so-called convex state.

When forming a silicon oxide film wherein TEOS is used for the material on the silicon substrate, a single wafer method is employed. The single wafer method is such that when a silicon oxide film is deposited to a thickness of 10 μm or more on only the front surface of the silicon substrate, the silicon substrate warps to the side on which the silicon oxide film is provided. That is, the silicon substrate is in a so-called convex state.

With an SOI substrate, tensile mode (concave state) warping occurs due to thermal oxidation (Japanese Patent No. 3,378,135). The greater the thickness of an embedded oxide film, the greater the amount of warping. When the thickness of the embedded oxide film is 5 μm, the SOI substrate warps 200 μm or more. Therefore, when all the silicon layers above the embedded oxide film are thermal oxide films, the amount of warping increases further.

When providing a single layer polyimide film or silicon oxide film on a silicon substrate in this way, there is a problem in that warping of the silicon substrate occurs during the manufacturing process due to a difference in thermal expansion rates. When the warping of the silicon substrate is 100 μm or more, the warping causes processing failures and conveying failures in the manufacturing process, as well as cracking of the semiconductor wafer. Also, problems of defocus and misalignment in a stepper device also occur.

A spin-on-glass (SOG) film is not suited to the increased film thickness needed in order to secure insulation in the high breakdown voltage passive element 50. Also, it is known that warping is reduced by providing a silicon oxide film on both the front and back surfaces of a silicon wafer (JP-A-2005-026404). In the document in question, a batch type low pressure CVD device is used. In the document in question, a TEOS film is formed while maintaining a balance in stress between the front surface and back surface of a silicon wafer. In the case of a low pressure CVD, however, the film formation rate is low in comparison with a plasma CVD. That is, the manufacturing time increases. Therefore, a low pressure CVD is not suited to the increased film thickness needed in order to secure insulation in the high breakdown voltage passive element 50. In addition, supposing provisionally that a long time is spent in thickly depositing a TEOS film using a low pressure CVD, there is a problem of air intake and exhaust system blockage, and a problem of the silicon wafer adhering to a boat portion and being difficult to remove.

Providing a silicon nitride film on both the front and back surfaces of a silicon wafer using a low pressure CVD device is also conceivable. However, the formation rate of a silicon nitride film is lower still than when providing a TEOS film. Therefore, a silicon nitride film is not suited to the increased film thickness needed in order to secure insulation in the high breakdown voltage passive element 50.

Also, providing a film that relaxes stress on the back surface of a silicon wafer is known technology (JP-A-08-227834). However, when providing an insulating film of a thickness approximately equivalent to that on the front surface on the back surface of a silicon wafer, production efficiency decreases, and cost rises notably.

Using glass, epoxy resin, or a die attach film (DAF) for an insulating film between passive elements is known as another warping reduction method (non-patent document ECCE 2014 pages 265 to 270, "Insulated Signal Transmission System using Planar Resonant Coupling Technology for High Voltage IGBT Gate Driver", and non-patent document ISPSD 2014 pages 442 to 445, "A Face-to-Face Chip Stacking 7 kV RMS Digital Isolator for Automotive And Industrial Motor Drive Applications").

The method using glass, epoxy resin, or a DAF is executed in an assembly step after chip fabrication. Therefore, processing is necessary for each chip, because of which manufacturing cost is high. Also, controlling a uniform film thickness between passive elements is difficult. In addition, there is also a problem of misalignment between chips.

In addition, reducing warping of a silicon wafer by reducing the phosphorus concentration to in the region of 2 wt % so that the thermal expansion coefficients of a phosphosilicate glass (PSG) film and boron phosphosilicate glass (BPSG) film are of the same extent as that of silicon is known technology (JP-A-07-142707). However, a PSG film with a low phosphorus concentration is hard, because of which there is a problem in that cracks occur when increasing the film thickness. In the same way, when a BPSG film or non-doped silicate glass (NSG) film has a low phosphorus concentration, cracks occur when increasing the film thickness.

Therefore, the insulating unit 40 of this example has a first insulating film 42, whose thermal expansion rate is lower than the thermal expansion rate of the substrate 32, and a second insulating film 44, formed on the first insulating film 42, whose thermal expansion rate is higher than the thermal expansion rate of the substrate 32. The first insulating film 42 may be a plasma TEOS film, and the second insulating film 44 may be a polyimide film or a polybenzoxazole film (hereafter abbreviated to PBO film).

A plasma TEOS film acting as the first insulating film 42 is a silicon oxide film fabricated by plasma CVD with TEOS as the raw material. As heretofore described, the thermal expansion rate of a silicon oxide film is 0.3 ppm/° C. Also, the thermal expansion rate of a polyimide film acting as the second insulating film 44 is 30 to 60 ppm/° C. Also, the thermal expansion rate of a PBO film acting as the second insulating film 44 is 30 to 50 ppm/° C. The thermal expansion rate of silicon carbide is 4.5 ppm/° C.

By stacking the first insulating film 42 with a thermal expansion rate lower than that of the substrate 32 and the second insulating film 44 with a thermal expansion rate higher than that of the substrate 32 as heretofore described, warping of the substrate 32 can be reduced. In the example, it is sufficient that the ratio between the thickness of the first insulating film 42 and the thickness of the second insulating film 44 is such as to offset the warping of the substrate 32. The ratio between the thickness of the first insulating film 42 and the thickness of the second insulating film 44 may be from 1:1 to 2:1. Specifically, the thickness of each of the first insulating film 42 and second insulating film 44 may be 0.5 to 3.0 μm, or may be 1 to 3.0 μm or more. According to the film thickness ratio or thickness of each insulating film, the amount of warping of the substrate 32 can be offset to a value less than 100 μm. For example, the amount of warping of the substrate 32 can be offset to 10 to 20 μm. When the difference between the thermal expansion rates of the substrate 32 and second insulating film 44 is greater than the difference between the thermal expansion rates of the substrate 32 and first insulating film 42, the warping of the substrate 32 can be offset further than when the thickness of the first insulating film 42 and the thickness of the second insulating film 44 are the same by arranging so that the thickness of the first insulating film 42 is greater than the thickness of the second insulating film 44.

The thickness of the insulating unit 40 of this example may be 5 μm or more. The thickness of the insulating unit 40 may be 6 μm or more, or may be 8 μm or more. The greater the thickness of the insulating unit 40, the higher the insulation that can be secured. In this example, even when increasing the film thickness of the insulating unit 40 in order to secure high insulation, the warping of the substrate 32 can be offset. Although the second insulating film 44 is provided above the first insulating film 42 in this example, the first insulating film 42 may be provided above the second insulating film 44. The first insulating film 42 and second insulating film 44 may be of the same thickness. In another example, multiple layers of the first insulating film 42 and second insulating film 44 may be stacked.

The first insulating film 42 and second insulating film 44 may be of another material. Specifically, the first insulating film 42 may be a plasma CVD film, and the second insulating film 44 may be a PSG film, a BPSG film, or an NSG film.

A plasma CVD film acting as the first insulating film 42 is a plasma TEOS film or a plasma silicon nitride film. A plasma silicon nitride film is a silicon nitride film fabricated by plasma CVD. As heretofore described, the thermal expansion rate of a silicon oxide film is 0.3 ppm/° C. Also, the thermal expansion rate of a plasma silicon nitride film is in the region of 3 ppm/° C., approximately the same as that of silicon. The thermal expansion rate of the plasma silicon nitride film may be a thermal expansion rate smaller than that of silicon. A PSG film, BPSG film, or NSG film acting as the second insulating film 44 may be a film with low phosphorus concentration. Generally, the thermal expansion rate of a PSG film, BPSG film, or NSG film is 5 to 10 ppm/° C. However, the thermal expansion rate can be brought nearer to the thermal expansion rate of silicon by lowering the phosphorus concentration. According to this configuration too, warping of the substrate 32 can be reduced.

A passivation film 22 is provided on the upper metal layer 20. The passivation film 22 may be a plasma TEOS film, or may be a plasma silicon nitride film. Furthermore, the planarized film 24 is provided on the passivation film 22. The planarized film 24 may be a polyimide film, or may be a PBO film.

Breakdown voltage between the lower metal layer 30 and upper metal layer 20 can be secured by the insulating unit 40 having the first insulating film 42 and second insulating film 44. In addition, warping of the substrate 32 can be restricted to a value smaller than 100 μm by the insulating unit 40. For example, warping of the substrate 32 can be restricted to 10 to 20 μm. Therefore, processing failures and conveying failures in the manufacturing process, as well as cracking of the semiconductor wafer, can be eliminated.

Figure 4:
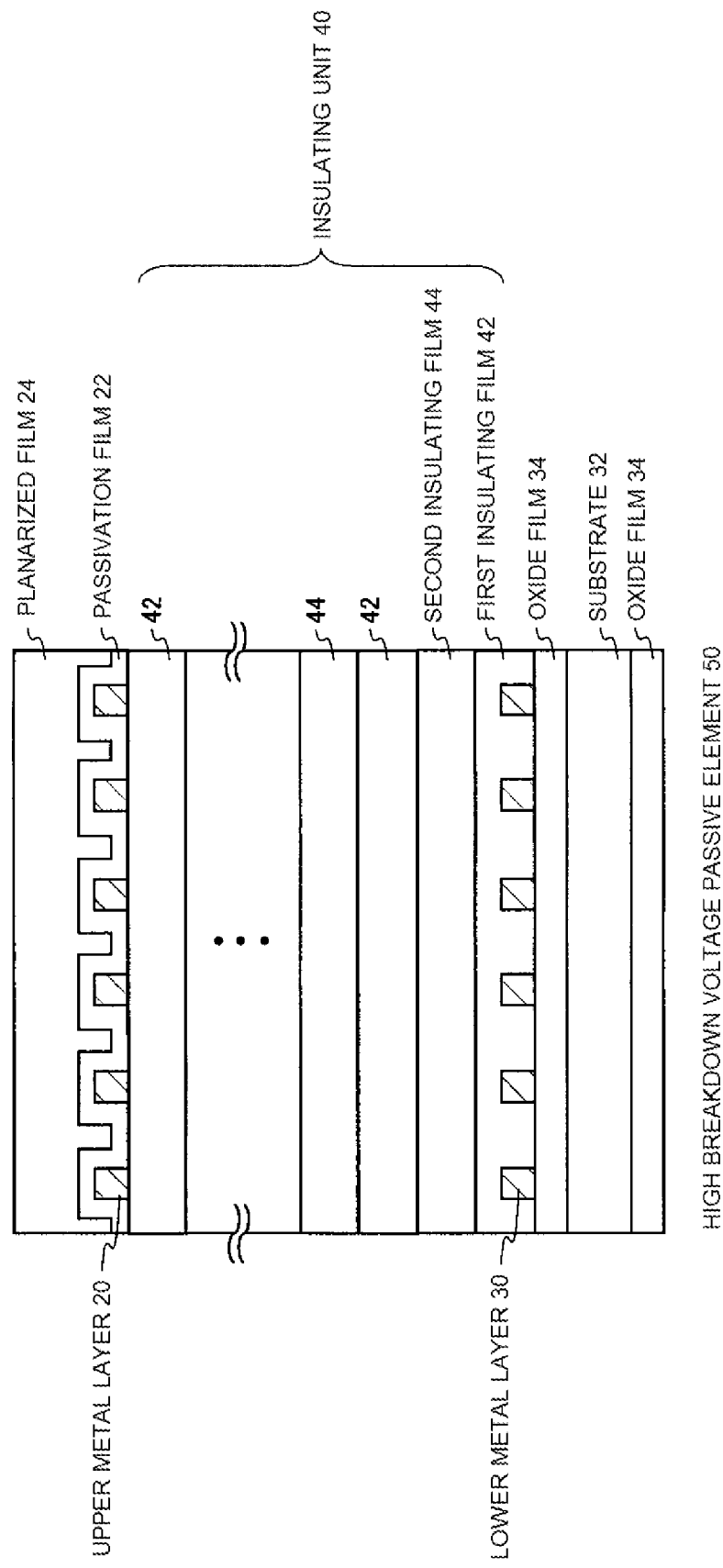
FIG. 4 is a diagram showing a second example of the stacked type high breakdown voltage passive element 50.

FIG. 4 is a diagram showing a second example of the stacked type high breakdown voltage passive element 50. In this example, multiple layers of the first insulating film 42 and second insulating film 44 are stacked. This point differs from the first example in FIG. 3. Other than this, the second example is the same as the first example.

In this example, the insulating unit 40 has two first insulating films 42 sandwiching the second insulating film 44. Also, the insulating unit 40 has two second insulating films 44 sandwiching the first insulating film 42. The thickness of each of the first insulating film 42 and second insulating film 44 may be 0.5 to 3.0 μm. The upper limit of an insulating film thickness of 0.5 to 3.0 μm is determined by the stress of a film adhering inside a chamber or furnace. When forming a film, there is a possibility of film stress becoming unsupportable when increasing the film thickness, and a film deposited inside a chamber or furnace falling off and adhering to the wafer as a foreign object, because of which the thickness of film that can be formed at one time is taken to be approximately 3.0 μm. Also, the ratio between the thickness of the first insulating film 42 and the thickness of the second insulating film 44 may be from 1:1 to 2:1. The thickness of the insulating unit 40 may be 5 μm or more. Also, the thickness of the insulating unit 40 may be 6 μm or more, or may be 8 μm or more. Warping of the substrate 32 can be restricted to 10 to 20 μm by the insulating unit 40. Also, insulation of the lower metal layer 30 and upper metal layer 20 can be secured. A plasma silicon nitride film with a high formation rate, and whose thickness can be increased easily, may be provided in the insulating unit 40 as a buffer layer. Also, when the difference between the thermal expansion rates of the substrate 32 and second insulating film 44 is greater than the difference between the thermal expansion rates of the substrate 32 and first insulating film 42, the thickness of the first insulating film 42 may be greater than the thickness of the second insulating film 44 in order to further offset the warping of the substrate 32.

Figure 5:
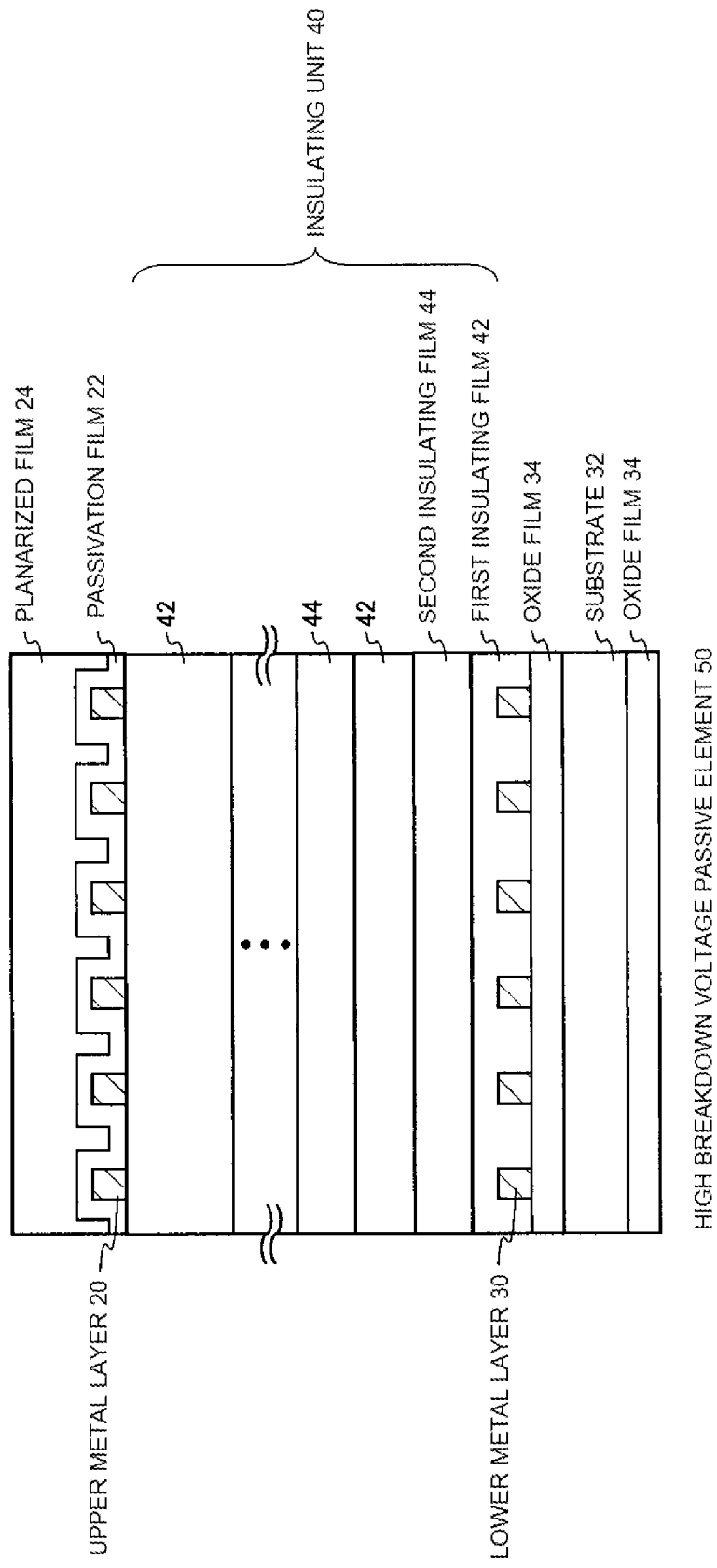
FIG. 5 is a diagram showing a third example of the stacked type high breakdown voltage passive element 50.

FIG. 5 is a diagram showing a third example of the stacked type high breakdown voltage passive element 50. In this example, the insulating film on the uppermost layer in the insulating unit 40 has a greater thickness than the other insulating films. This point differs from the second example in FIG. 4. Other than this, the third example is the same as the second example.

The insulating film on the uppermost layer in this example is the first insulating film 42. The insulating film on the uppermost layer in this example may be formed more thickly than the first insulating films 42 on layers lower than the insulating film on the uppermost layer by forming the first insulating film 42 a multiple of times. By the thickness of the insulating film on the uppermost layer being greater than the thickness of the other insulating films, the flatness of the insulating unit 40 can be secured. The insulating film on the uppermost layer may also be the second insulating film 44.

Figure 6:
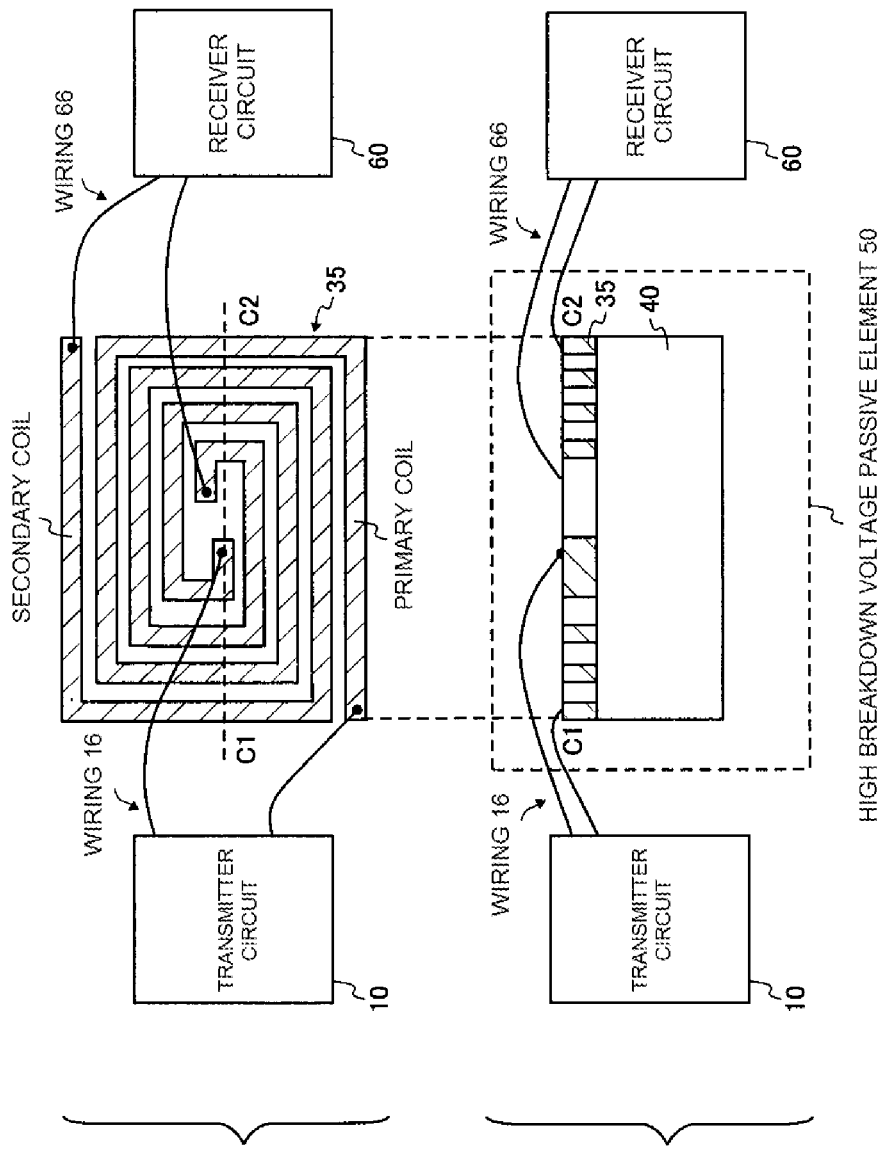
FIGS. 6A and 6B are diagrams showing a planar type high breakdown voltage passive element 50.

FIGS. 6A and 6B are diagrams showing the planar type high breakdown voltage passive element 50. FIG. 6A shows a top view of the high breakdown voltage passive element 50. FIG. 6B shows a sectional view of the high breakdown voltage passive element 50. A section C1-C2 of FIG. 6A is shown in FIG. 6B.

As shown in the top view of FIG. 6A, the primary coil and secondary coil are formed on a metal layer 35. Both ends of the primary coil are connected via the wiring 16 to the transmitter circuit 10. Also, both ends of the secondary coil are connected via the wiring 66 to the receiver circuit 60. As shown in the sectional view of FIG. 6B, the metal layer 35 is provided in one plane on the upper surface side of the insulating unit 40. The wiring 16 and wiring 66 are not provided in the insulating unit 40. The wiring 16 and wiring 66 are electrically connected to lead wiring units provided in the primary coil and secondary coil.

Figure 7:
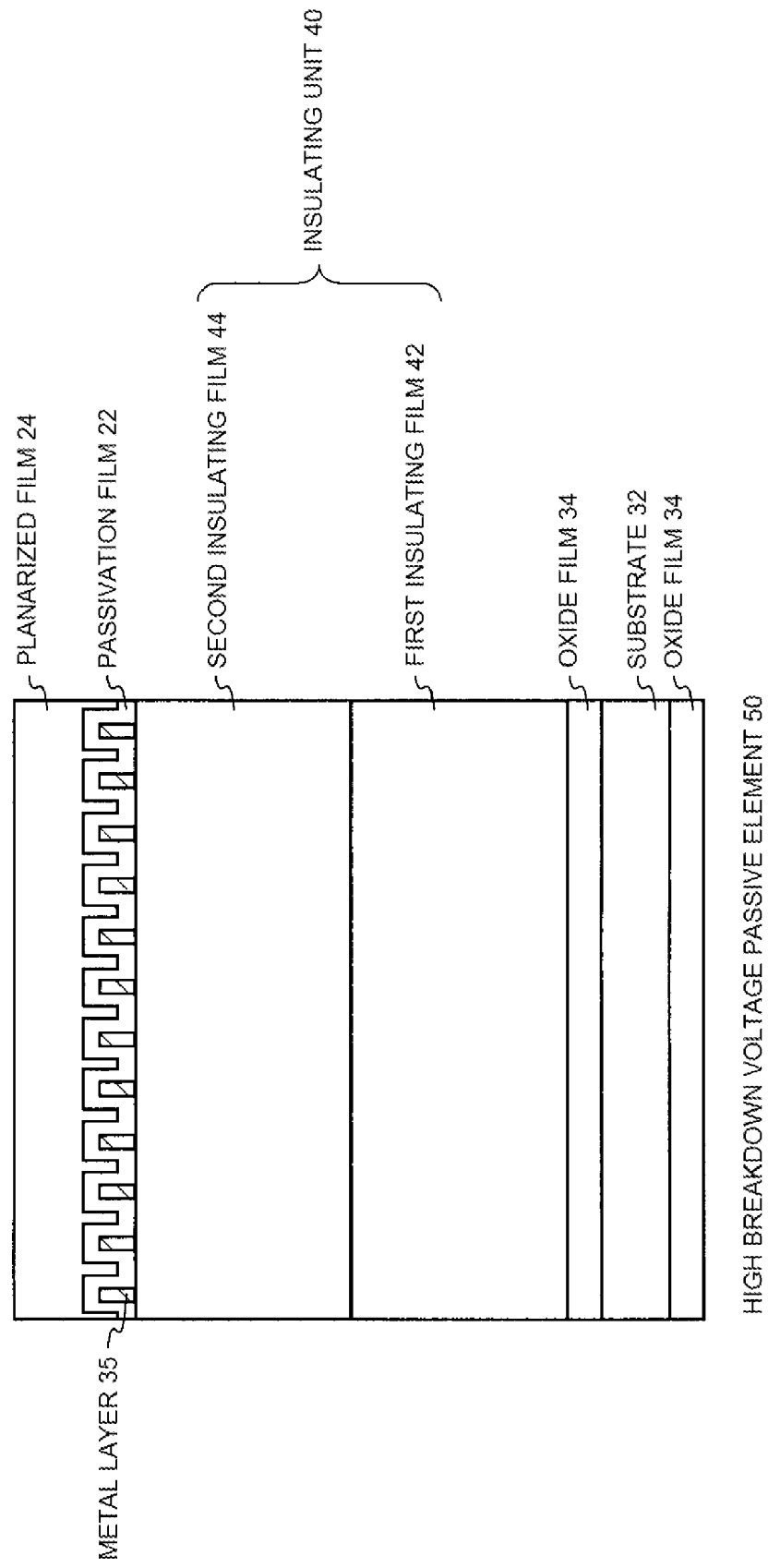
FIG. 7 is a diagram showing a first example of the planar type high breakdown voltage passive element 50.

FIG. 7 is a diagram showing a first example of the planar type high breakdown voltage passive element 50. The high breakdown voltage passive element 50 of this example includes the insulating unit 40 formed on the upper surface side of the substrate 32 and the metal layer 35 provided in one plane on the upper surface side of the insulating unit 40. In this example, the primary coil and secondary coil are formed on the metal layer 35. As opposed to this, in the first example of the stacked type high breakdown voltage passive element 50 (FIG. 3), the primary coil is provided on the upper metal layer 20, and the secondary coil is provided on the lower metal layer 30. This example and the example of FIG. 3 differ in this point. Other than this, this example and the example of FIG. 3 are the same.

In this example too, warping of the substrate 32 can be restricted to a value smaller than 100 μm by the insulating unit 40 having the first insulating film 42 and second insulating film 44. For example, warping of the substrate 32 can be restricted to 10 to 20 μm. Therefore, processing failures and conveying failures in the manufacturing process, as well as cracking of the semiconductor wafer, can be eliminated. In this example, the passivation film 22 and planarized film 24 isolate the primary coil and secondary coil.

Figure 8:
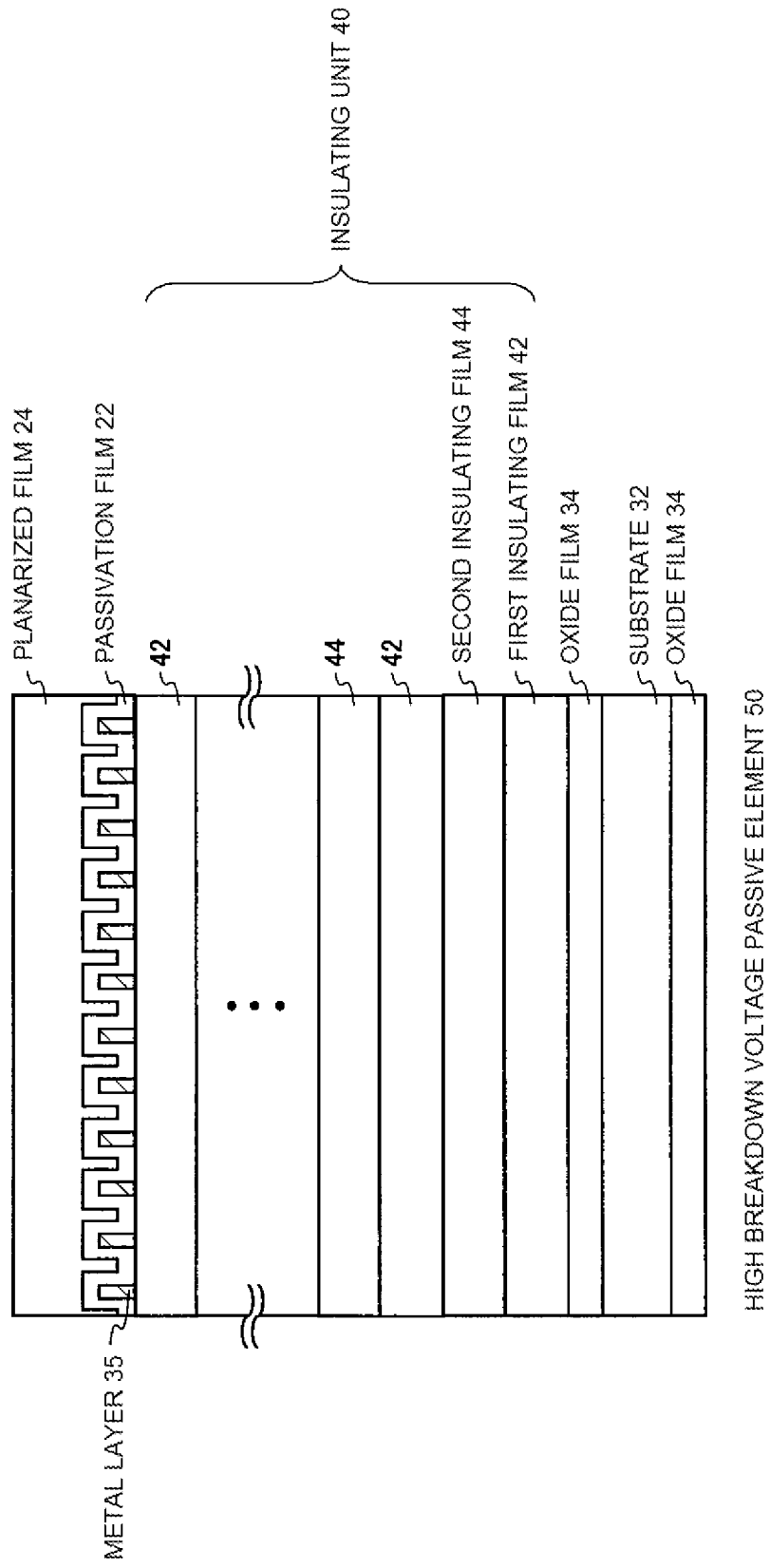
FIG. 8 is a diagram showing a second example of the planar type high breakdown voltage passive element 50.

FIG. 8 is a diagram showing a second example of the planar type high breakdown voltage passive element 50. This example corresponds to the second example of the stacked type high breakdown voltage passive element 50 (FIG. 4). In this example, however, the primary coil and secondary coil are formed on the metal layer 35. As opposed to this, in the example of FIG. 4, the primary coil is provided on the upper metal layer 20, and the secondary coil is provided on the lower metal layer 30. This example and the example of FIG. 4 differ in this point. Other than this, this example and the example of FIG. 4 are the same.

Figure 9:
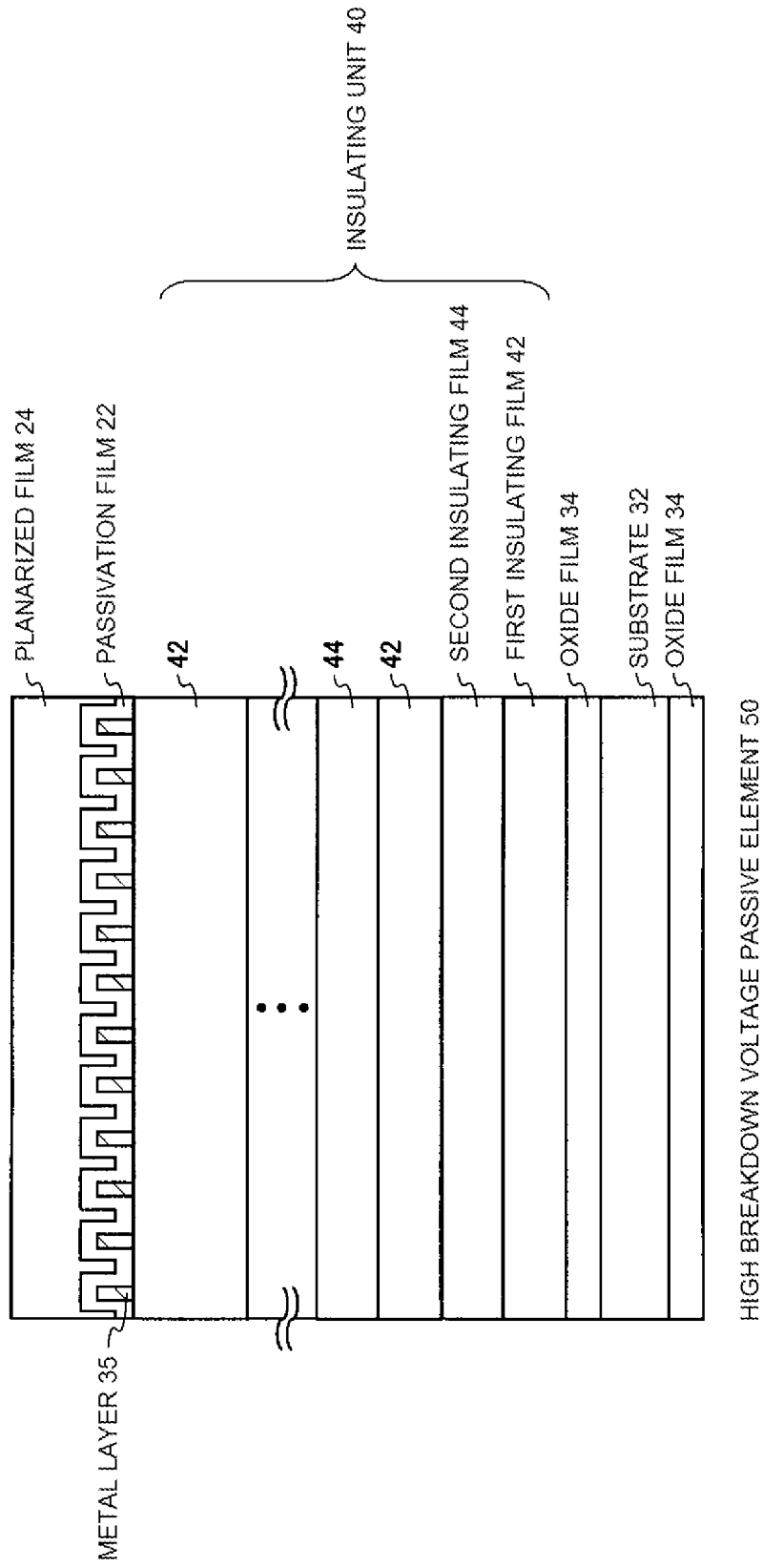
FIG. 9 is a diagram showing a third example of the planar type high breakdown voltage passive element 50.

FIG. 9 is a diagram showing a third example of the planar type high breakdown voltage passive element 50. This example corresponds to the third example of the stacked type high breakdown voltage passive element 50 (FIG. 5). In this example, however, the primary coil and secondary coil are formed on the metal layer 35. As opposed to this, in the example of FIG. 5, the primary coil is provided on the upper metal layer 20, and the secondary coil is provided on the lower metal layer 30. This example and the example of FIG. 5 differ in this point. Other than this, this example and the example of FIG. 5 are the same.

Stacked Type High Breakdown Voltage Passive Element 50 Manufacturing Method

Figure 10:
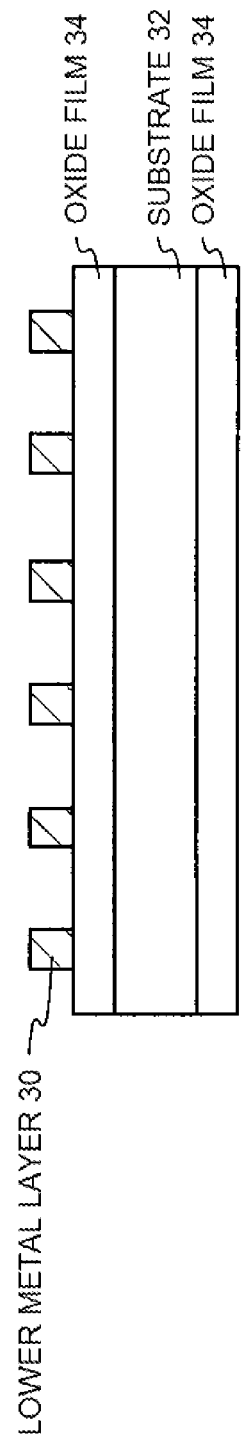
FIG. 10 is a diagram showing a stage of providing a lower metal layer 30 of the stacked type high breakdown voltage passive element 50.

FIG. 10 is a diagram showing a stage of providing the lower metal layer 30 of the stacked type high breakdown voltage passive element 50. In this example, firstly, a silicon substrate acting as the substrate 32 is annealed in a high temperature environment of 1,000° C. or more. By so doing, a thermal oxide film acting as the oxide film 34 is formed on the front surface and back surface of the silicon substrate. The thermal oxide films on the front surface and back surface may each have a thickness of 3 μm. When the substrate 32 is a silicon carbide substrate, a silicon oxide film may be formed on the front surface and back surface of the silicon carbide substrate.

Next, the lower metal layer 30 is provided on the front surface side of the substrate 32. Firstly, a thin film of aluminum (Al) or copper (Cu) is formed by sputtering. Subsequently, the thin film is patterned. By so doing, the lower metal layer 30, on which the secondary coil is to be formed, is formed.

Figure 11:
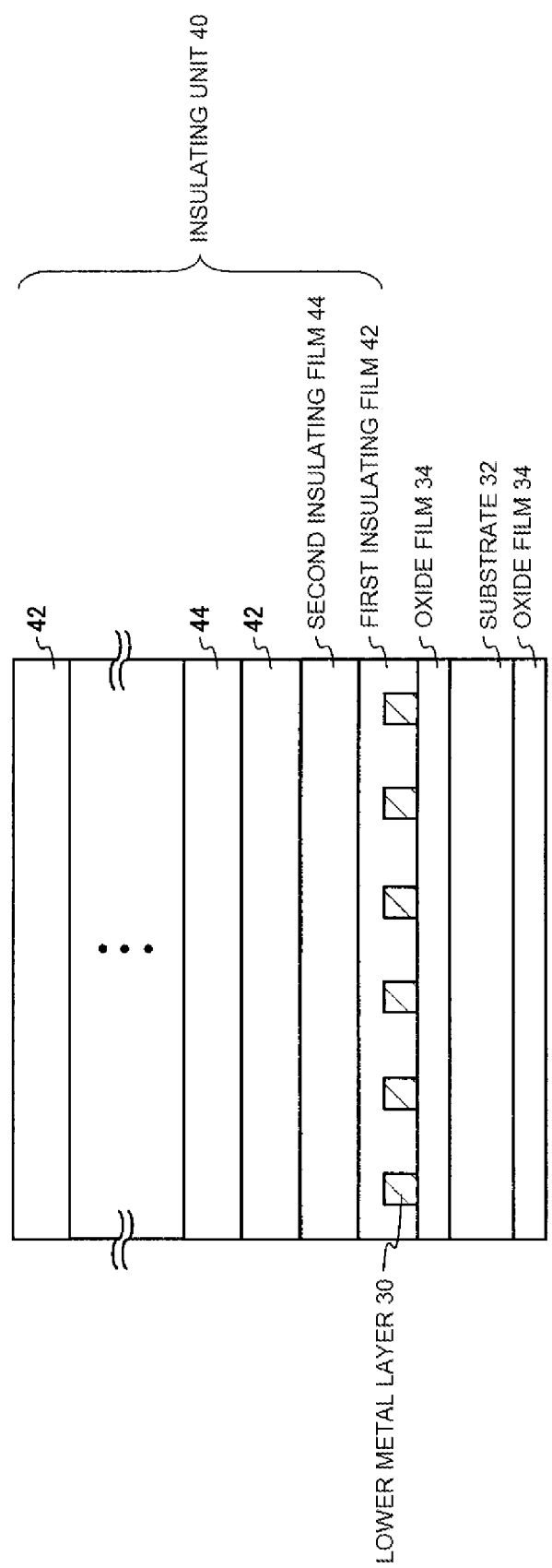
FIG. 11 is a diagram showing a stage of providing an insulating unit 40 in the stacked type high breakdown voltage passive element 50.

FIG. 11 is a diagram showing a stage of providing the insulating unit 40 in the stacked type high breakdown voltage passive element 50. The insulating unit 40, in which are stacked the first insulating film 42, whose thermal expansion rate is lower than the thermal expansion rate of the substrate 32, and the second insulating film 44, whose thermal expansion rate is higher than the thermal expansion rate of the substrate 32, is provided on the front surface side of the lower metal layer 30. The first insulating film 42 and second insulating film 44 may be the same as the first insulating film 42 and second insulating film 44 in the first example of the stacked type high breakdown voltage passive element 50 (FIG. 3).

In the insulating unit 40 of this example, multiple layers of the first insulating film 42 and second insulating film 44 are stacked. The thicknesses, ratio, and stacking order of the first insulating film 42 and second insulating film 44 may be the same as in the second example of the stacked type high breakdown voltage passive element 50 (FIG. 4). Instead of this, the thicknesses, ratio, and stacking order may be the same as in the third example of the stacked type high breakdown voltage passive element 50 (FIG. 5).

In this example, the temperature at which one of the first insulating film 42 or second insulating film 44 is formed is a temperature such that does not cause the properties of the other, already formed, film to change. A temperature that does not cause film properties to change means a temperature equal to or lower than the temperature at which the insulating film is formed. Therefore, the lower metal layer 30 can be prevented from melting even when the lower metal layer 30 is of a material with a low melting point. Also, when the already formed second insulating film 44 is a polyimide film or PBO film, the second insulating film 44 can be prevented from thermally decomposing.

The hardening temperature of a polyimide film acting as the second insulating film 44 is in the region of 400° C. When a hardened polyimide film is heated to 500° C. or more, the polyimide film thermally decomposes. A PBO film also hardens and thermally decomposes at temperatures in the same region. Therefore, a CVD method whereby the substrate is heated at a temperature in excess of 500° C. cannot be employed. For example, a CVD method whereby the substrate is heated in a reaction furnace of 800° C. to 1,000° C. cannot be employed.

As opposed to this, film formation is possible at a comparatively low temperature using a plasma CVD method. For example, a plasma CVD film (a plasma TEOS film or plasma silicon nitride film) can be formed at 350° C. to 450° C. Therefore, even when forming a plasma CVD film acting as the first insulating film 42 on a polyimide film acting as the second insulating film 44, the polyimide film does not thermally decompose. In this case, the temperature that does not cause film properties to change may be 450° C. By forming the plasma CVD film at 450° C. or less, the properties of the polyimide film can be prevented from changing. Also, deterioration in the durability of the polyimide film, and in adhesion to another film, can be prevented.

Figure 12:
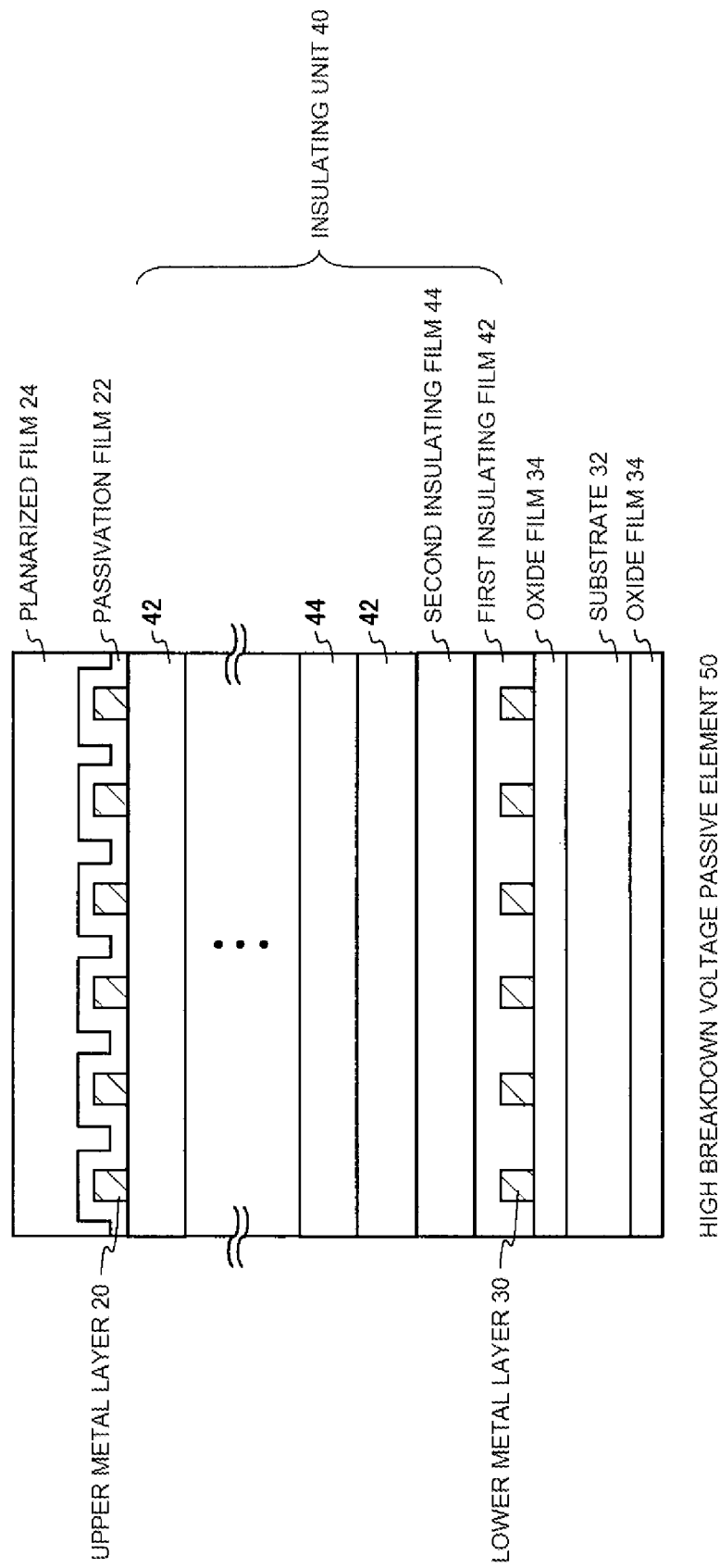
FIG. 12 is a diagram showing a stage of providing an upper metal layer 20 in the stacked type high breakdown voltage passive element 50.

FIG. 12 is a diagram showing a stage of providing the upper metal layer 20 in the stacked type high breakdown voltage passive element 50. A thin film of aluminum or copper is formed by sputtering, and the thin film is patterned. By so doing, the upper metal layer 20, on which the primary coil is to be formed, is formed on the front surface side of the insulating unit 40. Subsequently, the passivation film 22 is formed on the upper metal layer 20, and the planarized film 24 is formed on the passivation film 22.

Planar Type High Breakdown Voltage Passive Element 50 Manufacturing Method

Figure 13:
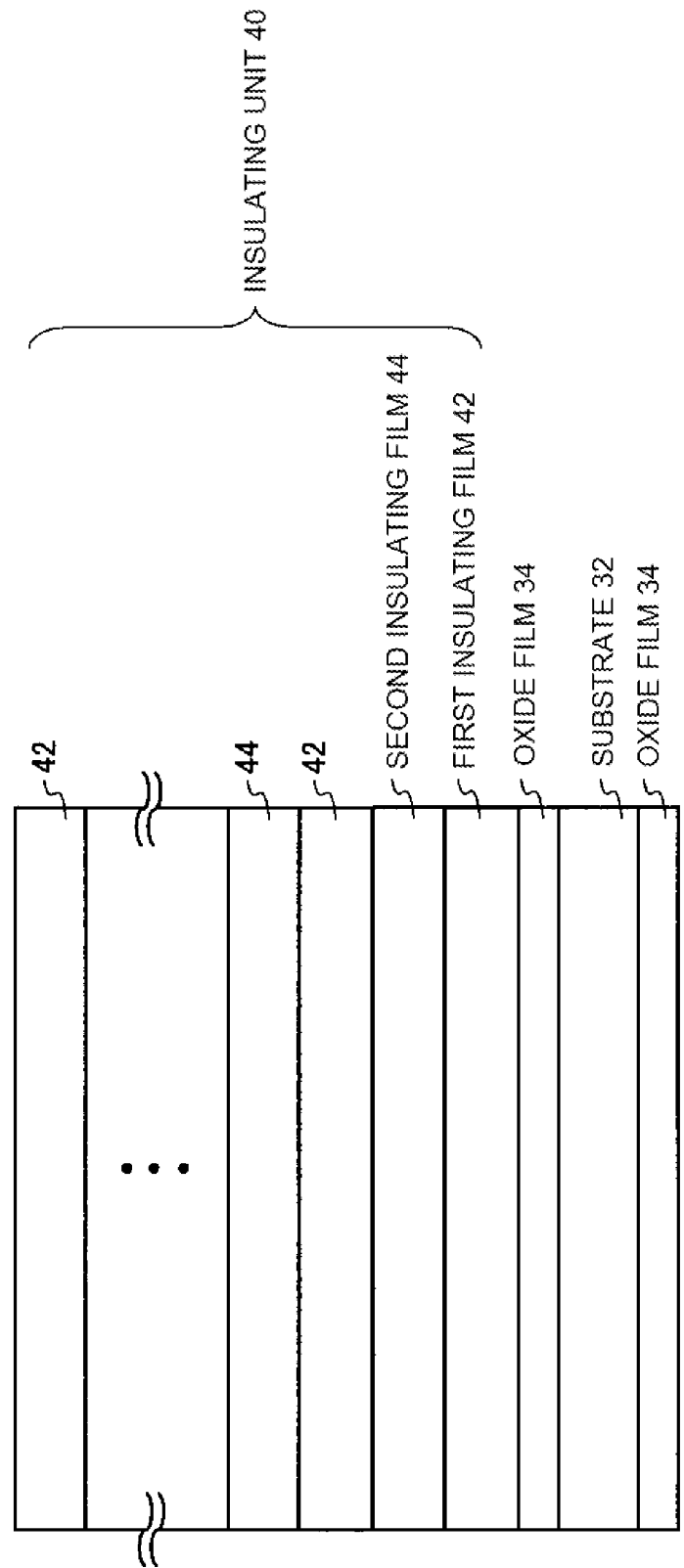
FIG. 13 is a diagram showing a stage of providing a first insulating film 42 and second insulating film 44 in the planar type high breakdown voltage passive element 50.

FIG. 13 is a diagram showing a stage of providing the first insulating film 42 and second insulating film 44 in the planar type high breakdown voltage passive element 50. Firstly, the oxide film 34 is provided on the substrate 32. This is the same as in the example of FIG. 10. Next, in this example, the first insulating film 42 and second insulating film 44 are provided on the oxide film 34, without providing the lower metal layer 30. This is the same as in the example of FIG. 11.

Figure 14:
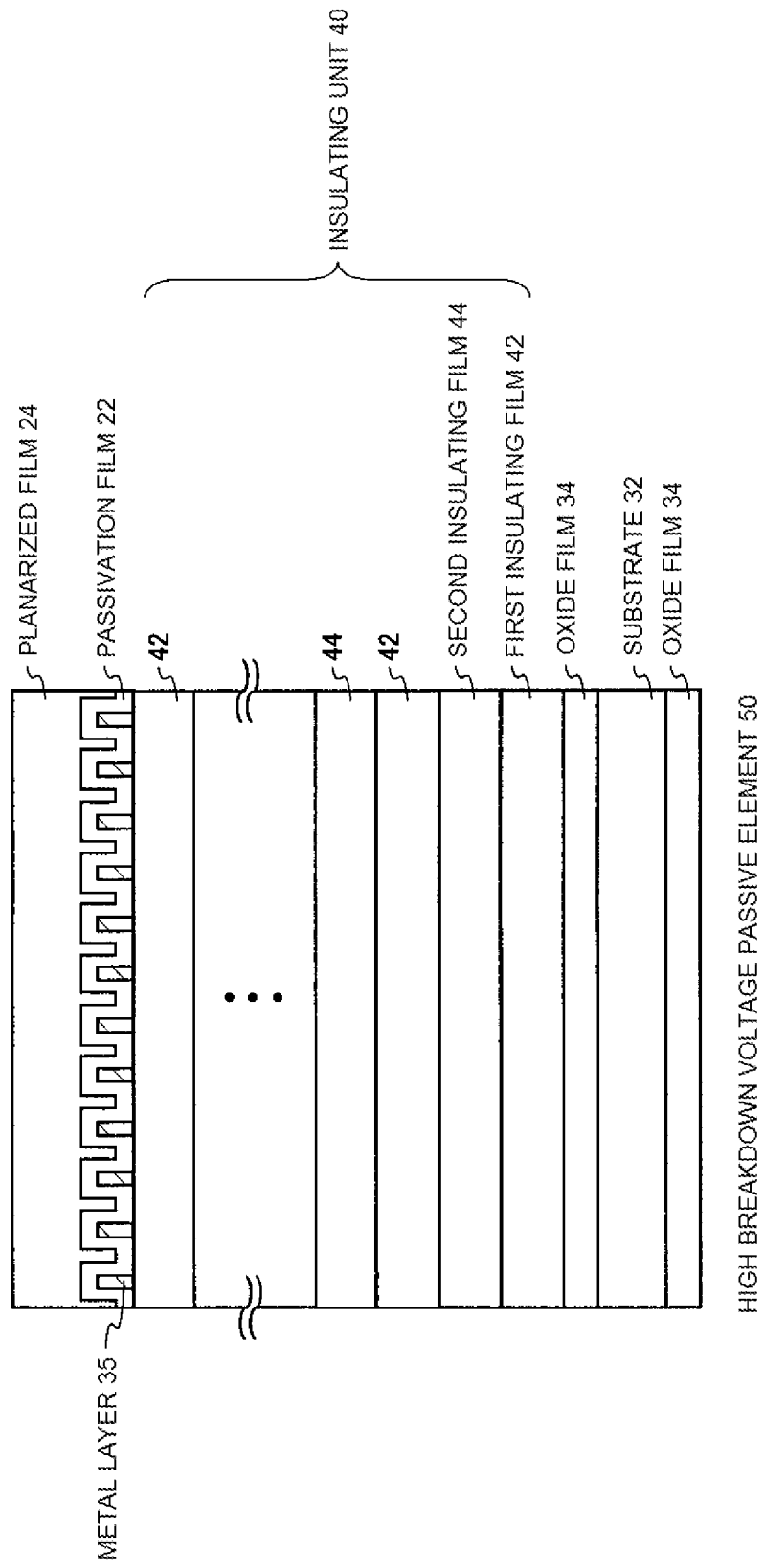
FIG. 14 is a diagram showing a stage of providing a metal layer 35 in the planar type high breakdown voltage passive element 50.

FIG. 14 is a diagram showing a stage of providing the metal layer 35 in the planar type high breakdown voltage passive element 50. A thin film of aluminum or copper is formed by sputtering on the first insulating film 42 and second insulating film 44. Subsequently, the thin film is patterned. By so doing, the metal layer 35, on which the primary coil and secondary coil are to be formed, is formed. Next, subsequently again, the passivation film 22 is formed on the upper metal layer 20, and the planarized film 24 is formed on the passivation film 22.

FIG. 15 is a diagram showing a high breakdown voltage capacitor 55. No coil is formed in the upper metal layer 20 or lower metal layer 30 of this example. The upper metal layer 20 and lower metal layer 30 of this example are of a plate form. Apart from this point, the high breakdown voltage capacitor 55 of this example has the same structure as the second example of the stacked type high breakdown voltage passive element 50 (FIG. 4). The high breakdown voltage capacitor 55 may have the same structure as either the first example (FIG. 3) or third example (FIG. 5) of the stacked type high breakdown voltage passive element 50. Therefore, a capacitor that simultaneously realizes voltage withstanding and substrate warping restriction can be realized.

Heretofore, the invention has been described using an embodiment, but the technical range of the invention is not limited by the range described in the embodiment. It will be clear to those skilled in the art that a wide variety of changes or improvements can be added to the embodiment. It is clear from the details of the patent claims that aspects wherein those kinds of change or improvement are added may be included in the technical range of the invention.

For example, transformers with ultra-high breakdown voltage of 10 kV or more are required for power lines, railroads, pumped-storage power generation, and the like. Among these, voltage from a 12 kV AC bus is converted via a step-down transformer into low voltage in a power line, but a power module including the high breakdown voltage passive element 50 of the invention and a switching element formed of a SiC device can be used for this voltage conversion.

It should be noted that the order of execution of processes in the operations, procedures, steps, stages, and the like, of the devices, systems, programs, and methods shown in the patent claims, specification, and drawings is not particularly specified by "before", "preceding", or the like, and provided that the output of a previous process is not used in a subsequent process, the processes can be realized in an arbitrary order. Regarding the operation flow in the patent claims, specification, and drawings, a description has been giving using "firstly", "next", and the like, for the sake of convenience, but this does not mean that it is essential to implement in this order.

What is claimed is:

1. A high breakdown voltage passive element, comprising:
    a substrate;
    a metal layer provided in one plane; and
    an insulating unit formed between the substrate and the metal layer, the metal layer being disposed on an upper surface side of the insulating unit, the insulating unit having three insulating films including two outer insulating films and an inner insulating film sandwiched by the two outer insulating films, the two outer insulating films having first thermal expansion rates, the inner insulating layer having a second expansion rate, one of the first thermal expansion rates and the second thermal expansion rate being higher that an expansion rate of the substrate, the other of the first expansion rates and the second expansion rate being lower than the expansion rate of the substrate.

2. The high breakdown voltage passive element according to claim 1, wherein a thickness of an insulating film on an uppermost layer in the insulating unit is greater than a thickness of all other insulating films of the insulating unit.

3. The high breakdown voltage passive element according to claim 1, wherein the first thermal expansion rates are higher than the thermal expansion rate of the substrate, and the second thermal expansion rate is lower than the thermal expansion rate of the substrate.

4. The high breakdown voltage passive element according to claim 1, wherein the first thermal expansion rates are lower than the thermal expansion rate of the substrate, and the second thermal expansion rate is higher than the thermal expansion rate of the substrate.

\* \* \* \* \*